(12) United States Patent
Lee

(10) Patent No.: US 6,961,399 B2
(45) Date of Patent: Nov. 1, 2005

(54) PHASE LOCKED LOOP INCLUDING CONTROL CIRCUIT FOR REDUCING LOCK-TIME

(75) Inventor: Jong-haeng Lee, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 726 days.

(21) Appl. No.: 09/867,971

(22) Filed: May 30, 2001

(65) Prior Publication Data

US 2002/0054657 A1 May 9, 2002

(30) Foreign Application Priority Data

Nov. 4, 2000 (KR) ................. 2000-65352

(51) Int. Cl.[7] ............... H03D 3/24; H04L 25/00
(52) U.S. Cl. ............. 375/376; 375/371
(58) Field of Search .............. 375/354, 371, 375/373, 374, 375, 376

(56) References Cited

U.S. PATENT DOCUMENTS 5,008,629 A * 4/1991 Ohba et al. ............ 327/107
5,128,623 A * 7/1992 Gilmore ................ 327/107
5,748,043 A * 5/1998 Koslov ................ 331/1 A
5,838,205 A * 11/1998 Ferraiolo et al. .......... 331/2

FOREIGN PATENT DOCUMENTS

EP 0435552 3/1991

* cited by examiner

Primary Examiner—Chieh M. Fan
Assistant Examiner—Jason M. Perilla
(74) Attorney, Agent, or Firm—F. Chau & Associates, LLC

(57) ABSTRACT

A PLL circuit includes a control circuit for generating a reference control signal. A reception divider, reference divider, and transmission divider respectively divide an output signal of a receiver VCO according to a reception division data signal, an output signal of a crystal oscillator according to a reference division data signal, and an output signal of a transmitter VCO according to a transmission division data signal. A first and second phase detector respectively detect frequency and phase differences between a reception divider output and a reference divider output and between a transmission divider output and the reference divider output.

16 Claims, 6 Drawing Sheets

PHASE LOCKED LOOP INCLUDING CONTROL CIRCUIT FOR REDUCING LOCK-TIME

BACKGROUND OF THE INVENTION

1. Technical Field

The present invention generally relates to frequency synthesizers for wired or wireless communications and, more particularly, to a phase locked loop (PLL) that includes a control circuit for reducing lock-time.

2. Description of Related Art

A digital frequency synthesizer is a phase locked loop (PLL) which is capable of outputting a wide range of frequencies by adjusting the values of a programmable counter. Such a PLL has been used in communication systems such as ham radios, wireless phones, and in airplanes. In general, the digital frequency synthesizer generates an output signal which is an integer multiple of a reference input frequency input thereto.

FIG. 1 is a block diagram illustrating an embodiment of a basic frequency synthesizer used in communications, according to the prior art. The frequency synthesizer includes a microcomputer (MICOM) 11, a crystal oscillator (X-OSC) 12, a phase locked loop (PLL) 100, a receiver-voltage-controlled oscillator (RX-VCO) 13 and a transmitter-voltage-controlled oscillator (TX-VCO) 14. The microcomputer 11 outputs two series of data D/D and En and a control clock (CLK) signal which are used for controlling the PLL 100. The serial data D/D is a signal having information corresponding to the reception division ratio, the reference division ratio and the transmission division ratio. The other serial data En is a signal that includes a reception enable signal, a reference enable signal and a transmission enable signal. According to the control clock (CLK), the serial data D/D and En are input into the PLL 100.

The crystal oscillator 12 is a source of reference frequency signal X/O whose frequency and phase are compared to that of an output signal R/V of the receiver voltage-controlled oscillator 13 and an output signal T/V of the transmitter-voltage-controlled oscillator 14.

The receiver-voltage-controlled oscillator 13 is used in the case when a wired/wireless phone is in a reception mode, and the transmitter-voltage-controlled oscillator 14 is used in the case when a wired or wireless phone is in a transmitting mode.

The PLL 100 is used to stabilize the outputs of voltage-controlled oscillators 13 and 14 at an appropriate frequency so that a wired or wireless phone system can be operated at a normal operating frequency. The PLL includes a latch 111, a reception divider 112, a reference divider 113, a transmission divider 114, a first phase detector 115 and a second phase detector 116.

The latch 111 receives the two serial data signal D/D and En and the control clock CLK from the microcomputer 11 and then outputs a reception division data signal RXDD, a reference division data signal REFDD, a transmission division data signal TXDD, a reception enable signal RXEN, a reference enable signal REFEN and a transmission enable signal TXEN.

The reception divider 112 receives the reception division data RXDD in response to the reception enable signal RXEN and divides the output signal R/V of the receiver-voltage-controlled oscillator 13 according to the reception division data signal RXDD.

The reference divider 113 receives the reference division data signal REFDD in response to the reference enable signal REFEN and divides the output signal X/O of the crystal oscillator 12 according to the reference division data signal REFDD.

The transmission divider 114 receives the transmission division data signal TXDD in response to the transmission enable signal TXEN and divides the output signal T/V of the transmitter-voltage-controlled oscillator 14 according to the transmission division data signal TXDD.

The first phase detector 115 receives an output signal FDRX of the reception divider 112 and the output signal FDREF of the reference divider 113 and then detects the difference in frequency and phase therebetween. The second phase detector 116 receives an output signal FDTX of the transmission divider 114 and the output signal FDREF of the reference divider 113 and then detects the difference in frequency and phase therebetween.

FIG. 2 is a view diagram illustrating waveforms of signals in the operation of the conventional PLL shown in FIG. 1. In this drawing, CLK is the system clock used in a wired or wireless communications system. Referring to FIG. 2, when a reception enable signal RXEN is logic high, an output signal FDRX of the reception divider 112 is generated. The output signal FDRX is the resultant signal generated by dividing the output signal R/V of the receiver-voltage-controlled oscillator 13 according to a division ratio of the reception division data signal RXDD.

When a transmission enable signal TXEN is logic high, an output signal FDTX of the transmission divider 114 is generated. When a reference enable signal REFEN is logic high, an output signal FDREF of the reference divider 113 is generated. The output signal FDTX is the resultant signal of dividing the output signal T/V of the transmitter-voltage-controlled oscillator 14 according to the division ratio of the transmission division data signal TXDD. The output signal FDREF is the resultant signal of dividing the output signal X/O of the crystal oscillator 12 according to a division ratio of the reference division data signal REFDD.

The first and second phase detectors 115 and 116 detect the frequency and phase differences among the output signals FDRX, FDREF and FDTX of the dividers 112, 113 and 114. Referring again to FIG. 2, the phase difference between the output signals FDRX and FDREF is indicated as RX-phase error and the phase difference between the output signals FDREF and FDTX is indicated as TX-phase error.

The RX-phase error and the TX-phase error are basically different from each other by the period of the enable signal EN. Accordingly, the phase difference between the two compared signals FDRX and FDREF or FDREF and FDTX is equal to the original phase difference between the two compared signals FDRX and FDREF or FDREF and FDTX added to the RX-phase error or the TX-phase error. Therefore, the lock-time of the PLL becomes longer.

SUMMARY OF THE INVENTION

To solve the above and other related problems of the prior art, there is provided a phase locked loop (PPL) that includes a control circuit for synchronizing signals that are compared to each other and for reducing lock-time.

According to an aspect of the invention, there is provided a phase locked loop (PLL) circuit having a receiver voltage controlled oscillator (VCO), a transmitter VCO, and a crystal oscillator. The PLL circuit includes a control circuit for generating a reference control signal in response to a reception enable signal and a transmission enable signal. A reception divider receives a reception division data signal in response to the reception enable signal and divides an output signal of the receiver VCO according to the reception division data signal. A reference divider receives a reference division data signal in response to the reference control signal of the control circuit and divides the output signal of a crystal oscillator according to the reference division data signal. A transmission divider receives a transmission division data signal in response to the transmission enable signal and divides an output signal of the transmitter VCO according to the transmission division data signal. A first phase detector detects frequency and phase differences between an output signal of the reception divider and an output signal of the reference divider. A second phase detector detects the frequency and phase differences between an output signal of the transmission divider and the output signal of the reference divider.

According to another aspect of the invention, there is provided a phase locked loop circuit having a receiver voltage controlled oscillator (VCO), a transmitter VCO, and a crystal oscillator. The PLL circuit includes a control circuit for outputting a reception control signal and a transmission control signal in response to a reception enable signal, and a transmission enable signal. A reception divider receives a reception division data signal in response to the reception control signal and divides an output signal of the receiver VCO according to the reception division data signal. A reference divider receives a reference division data signal in response to a reference enable signal and divides an output signal of the crystal oscillator according to the reference division data signal. A transmission divider receives a transmission division data signal in response to the transmission control signal of the control circuit and divides an output signal of the transmitter VCO according to the transmission division data signal. A first phase detector detects frequency and phase differences between an output signal of the reception divider and an output of the reference divider. A second phase detector detects the frequency and phase differences between an output signal of the transmission divider and an output signal of the reference divider.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1:
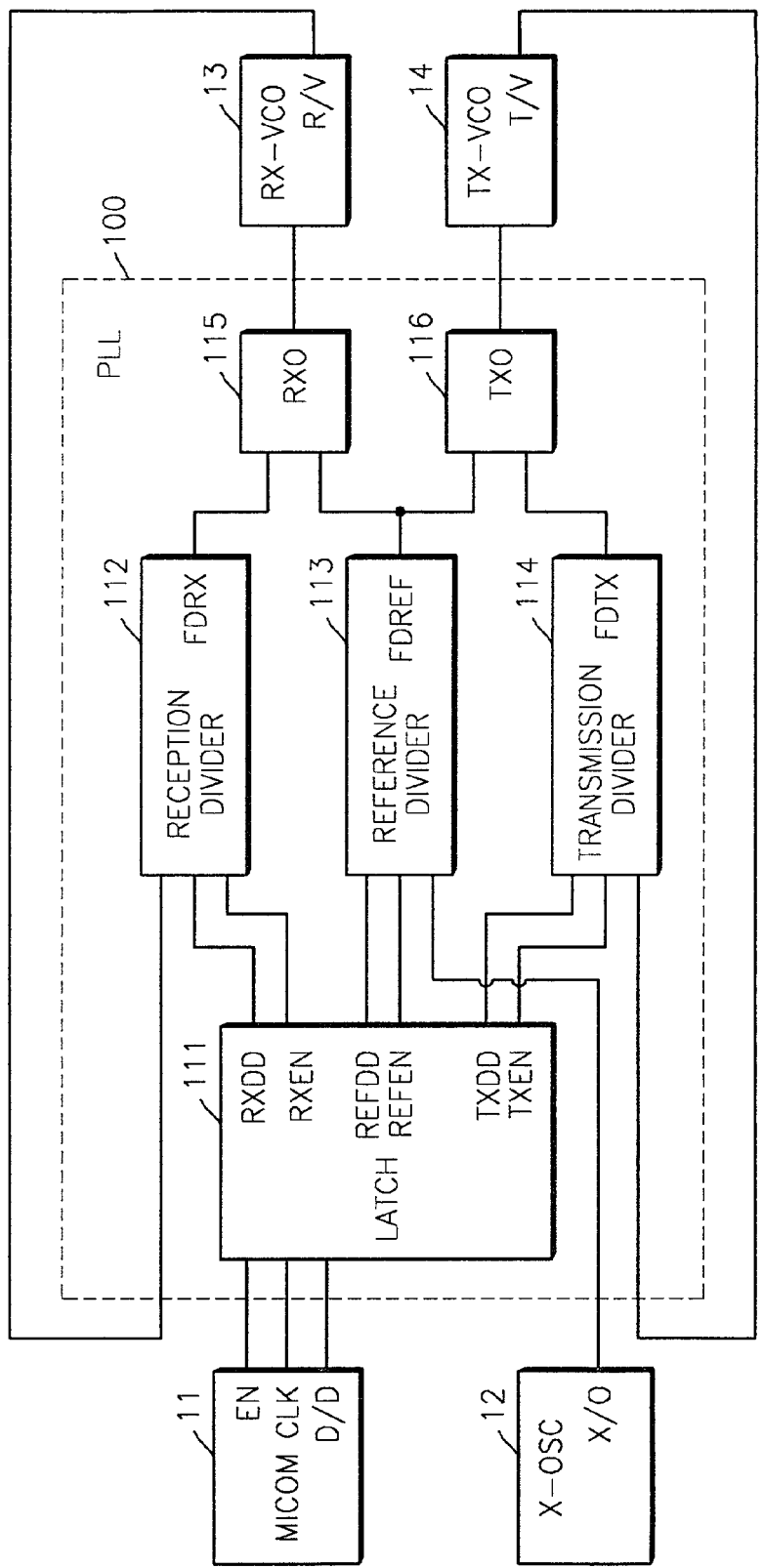
FIG. 1 is a block-diagram illustrating a conventional frequency synthesizer used in communications.
Figure 2:
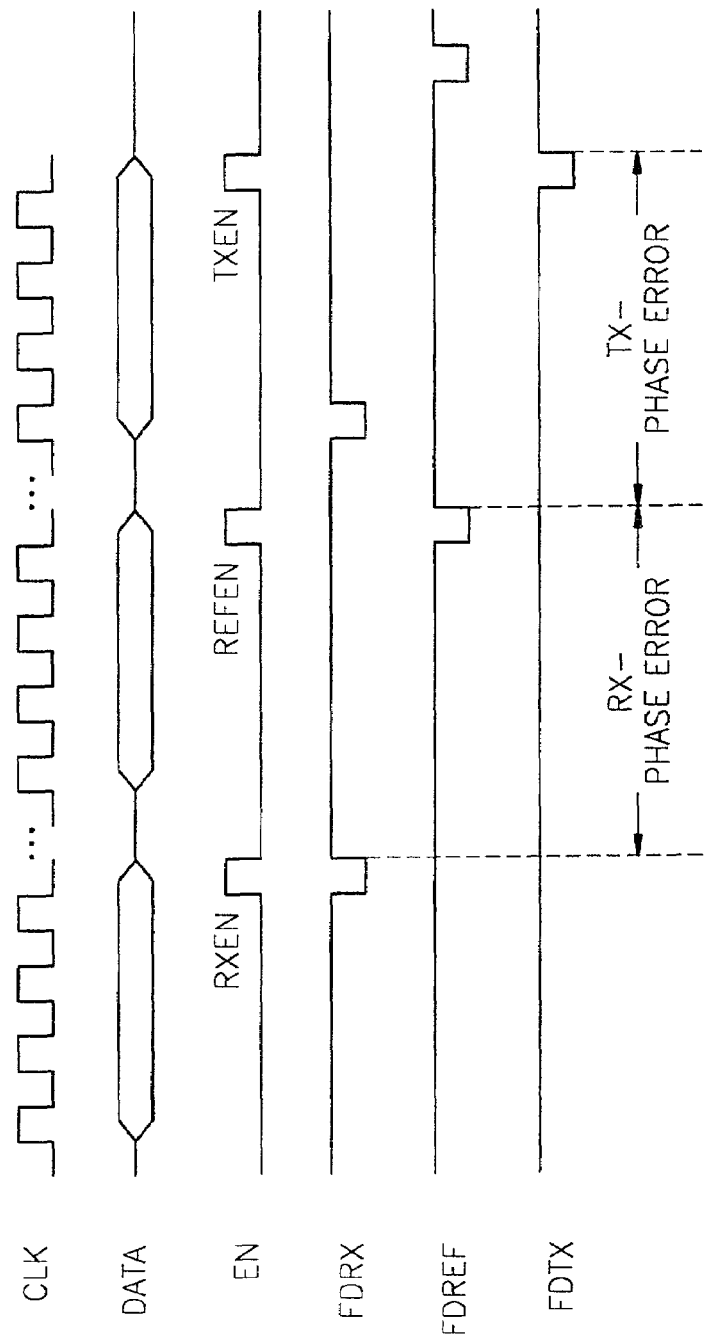
FIG. 2 is a view diagram illustrating waveforms of signals in the operation of the conventional phase locked loop shown in FIG. 1.

The present invention will now be described more fully with reference to the accompanying drawings, in which preferred embodiments of the invention are shown. It is noted that like reference numerals may be used to designate identical or corresponding parts throughout the drawings.

Figure 3:
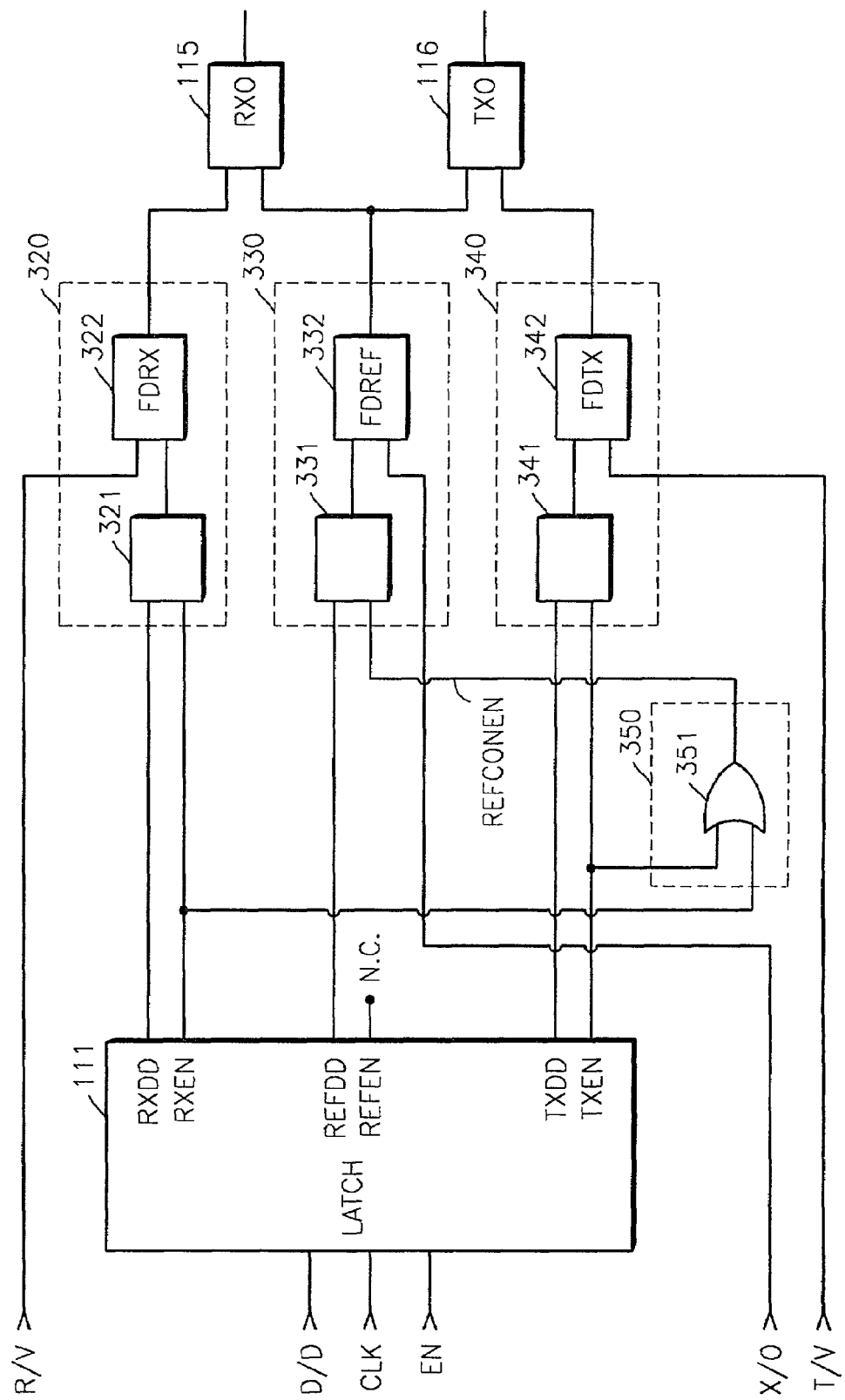
FIG. 3 is a block-diagram illustrating a phase locked loop including a control circuit, according to a first illustrative embodiment of the present invention.

FIG. 3 is a block-diagram illustrating a phase locked loop (PLL) including a control circuit, according to a first illustrative embodiment of the present invention. The PLL includes a latch 111, a first control circuit 350, a reception divider 320, a reference divider 330, a transmission divider 340, a first phase detector 115 and a second phase detector 116.

The latch 111 receives serial data D/D from a microcomputer (not shown) and then outputs a reception division data signal RXDD, a reference division data signal REFDD and a transmission division data signal TXDD. Also, the latch 111 receives another serial data En and then outputs a reception enable signal RXEN, a reference enable signal REFEN and a transmission enable signal TXEN.

The first control circuit 350 performs logic-OR operation on the reception enable signal RXEN and the transmission enable signal TXEN which are received from the latch 111 and then outputs a first control signal REFCONEN.

The reception divider 320 includes a first switch 321 and a reception counter 322. The first switch 321 switches the reception division data signal RXDD in response to the reception enable signal RXEN and the reception counter 322 divides an output signal R/V of a receiver-voltage-controlled oscillator (not shown) according to the reception division data signal RXDD received via the first switch 321.

The reference divider 330 includes a second switch 331 and a reference counter 332. The second switch 331 switches the reference division data signal REFDD in response to the output signal REFCONEN of the first control circuit 350 and the reference counter 332 divides an output signal X/O of a crystal oscillator (not shown) according to the reference division data signal REFDD.

The transmission divider 340 includes a third switch 341 and a transmission counter 342. The third switch 341 switches the transmission division data signal TXDD in response to the transmission enable signal TXEN and then divides an output signal T/V of a transmitter-voltage-controlled oscillator (not shown) according to the transmission division data signal TXDD.

The first phase detector 115 detects the difference between the output signal FDRX of the reception divider 322 and the output signal FDREF of the reference divider 330 in phase and frequency and the second phase detector 116 detects the difference between the output signal FDTX of the transmission divider 340 and the output signal FDREF of the reference divider 330 in phase and frequency.

Figure 4:
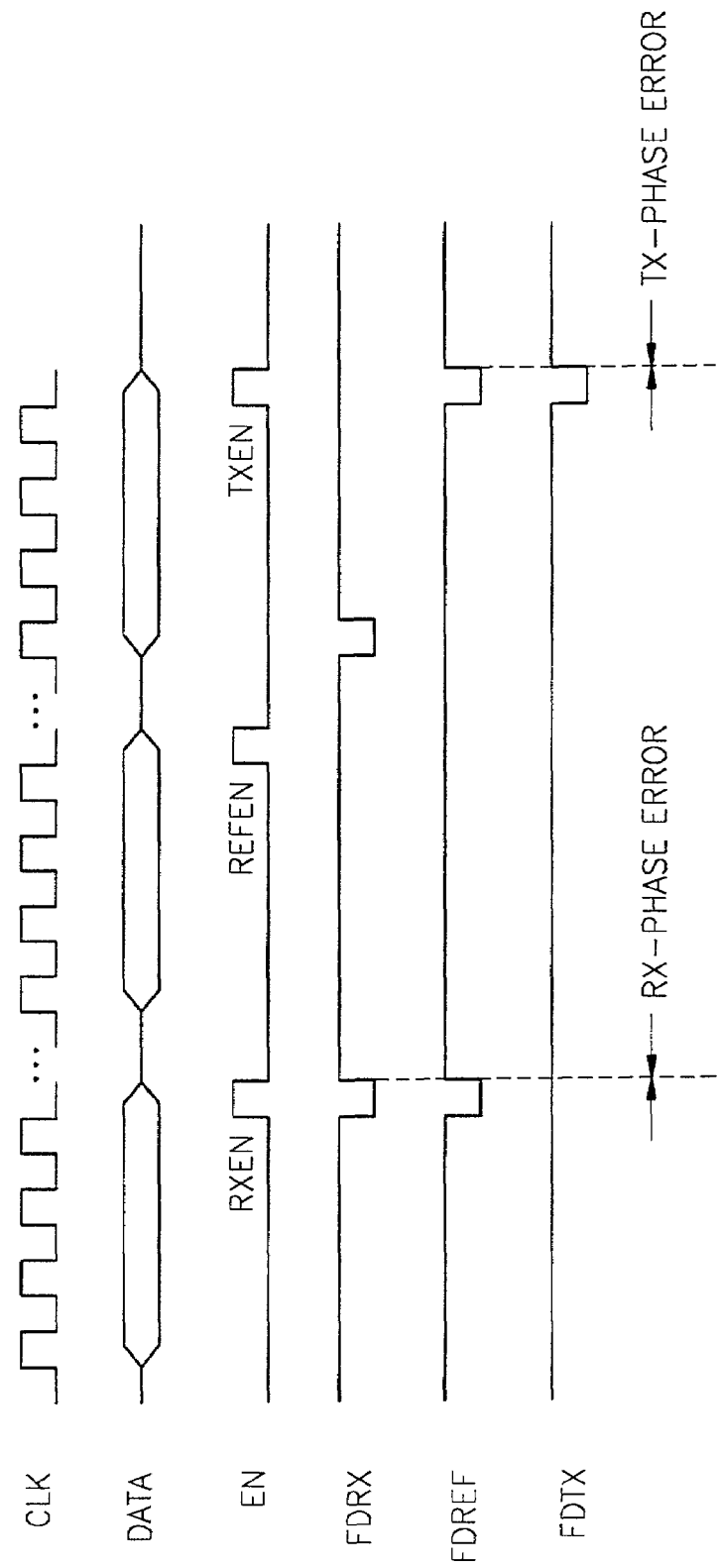
FIG. 4 is a waveform diagram illustrating signals corresponding to the operation of the phase locked loop of FIG. 3, according to an illustrative embodiment of the invention.

FIG. 4 is a waveform diagram illustrating signals corresponding to the operation of the phase locked loop of FIG. 3, according to an illustrative embodiment of the invention. When the reception enable signal RXEN is logic high, the output signal FDRX of the reception divider 320 is generated. At this time, the output signal REFCONEN of the first control circuit 350 becomes logic high and therefore the output signal FDREF of the reference divider 330 is generated simultaneously.

When the transmission enable signal TXEN is logic high, the output signal FDTX of the transmission divider 340 is generated. At this time, the output signal REFCONEN of the first control circuit 350 becomes logic high and therefore the output signal FDREF of the reference divider 330 is generated simultaneously.

The two compared signals described above, such as FDRX and FDREF or FDTX and FDREF are synchronized just as they are generated. Therefore, lock-time is determined depending on the actual phase and frequency differences between the two compared signals.

Figure 5:
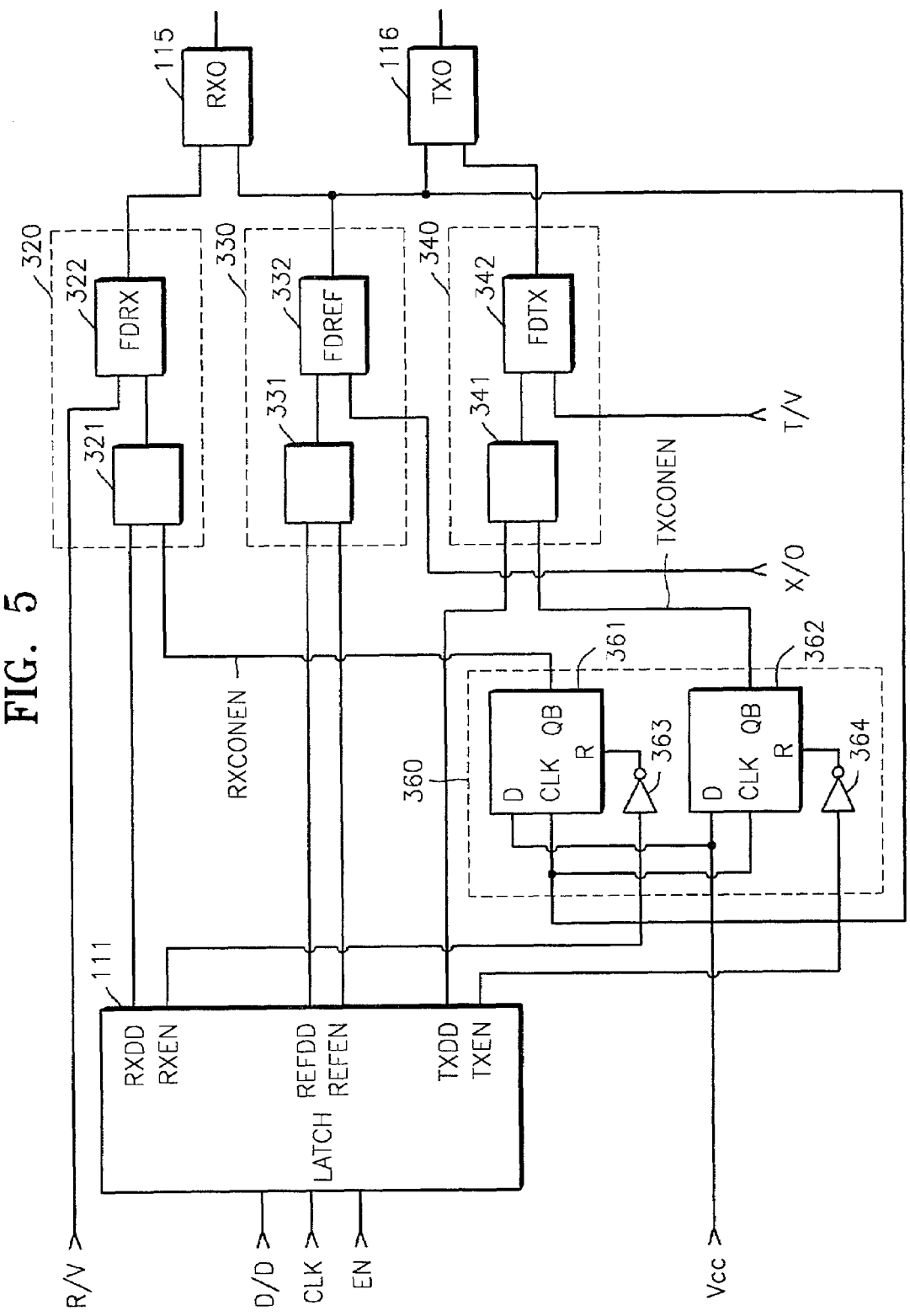
FIG. 5 is a block-diagram illustrating a phase locked loop including a control circuit, according to a second illustrative embodiment of the present invention.

FIG. 5 is a block diagram illustrating a phase locked loop, according to a second embodiment of the present invention. Referring to FIG. 5, the phase locked loop (PLL) includes a latch 111, a second control circuit 360, a reception divider 320, a reference divider 330, a transmission divider 340, a first phase detector 115 and a second phase detector 116.

The latch 111 receives serial data D/D from a microcomputer (not shown) and then outputs a reception division data signal RXDD, a reference division data signal REFDD and a transmission division data signal TXDD. Also, the latch 111 receives another serial data EN and then outputs a reception enable signal RXEN, a reference enable signal REFEN and a transmission enable signal TXEN.

The second control circuit 360 includes a first inverter 363, a second inverter 364, a first flip-flop 361 and a second flip-flop 362. The first inverter 363 inverts the reception enable signal RXEN and the second inverter 364 inverts the transmission enable signal TXEN.

The first flip-flop 361 including a clock terminal CLK to which an output signal FDREF of the reference divider 330, an input terminal D to which a power voltage Vcc is applied, and a reset terminal R to which the output signal of the first inverter 363 is applied, outputs a reception control signal RXCONEN from an output terminal QB within itself.

The second flip-flop 362 including a clock terminal CLK to which an output signal FDREF of the reference divider 330, an input terminal D to which a power voltage Vcc is applied, and a reset terminal R to which the output signal of the second inverter 364 is applied, outputs a transmission control signal TXCONEN from an output terminal QB within itself.

The reception divider 320 includes a first switch 321 and a reception counter 322. The first switch 321 switches the reception division data signal RXDD in response to the reception control signal RXCONEN and the reception counter 322 divides an output signal R/V of a receiver-voltage-controlled oscillator (not shown) according to the reception division data signal RXDD received via the first switch 321.

The reference divider 330 includes a second switch 331 and a reference counter 332. The second switch 331 switches the reference division data signal REFDD in response to the reference enable signal REFEN and the reference counter 332 divides an output signal X/O of a crystal oscillator (not shown) according to the reference division data signal REFDD.

The transmission divider 340 includes a third switch 341 and a transmission counter 342. The third switch 341 switches the transmission division data signal TXDD in response to the transmission control signal TXCONEN of the second control circuit 360 and then divides an output signal T/V of a transmitter-voltage-controlled oscillator (not shown) according to the transmission division data signal TXDD.

The first phase detector 115 detects the difference between the output signal FDRX of the reception divider 320 and the output signal FDREF of the reference divider 330 in phase and frequency and the second phase detector 116 detects the difference between the output signal FDTX of the transmission divider 340 and the output signal FDREF of the reference divider 330 in phase and frequency.

Figure 6:
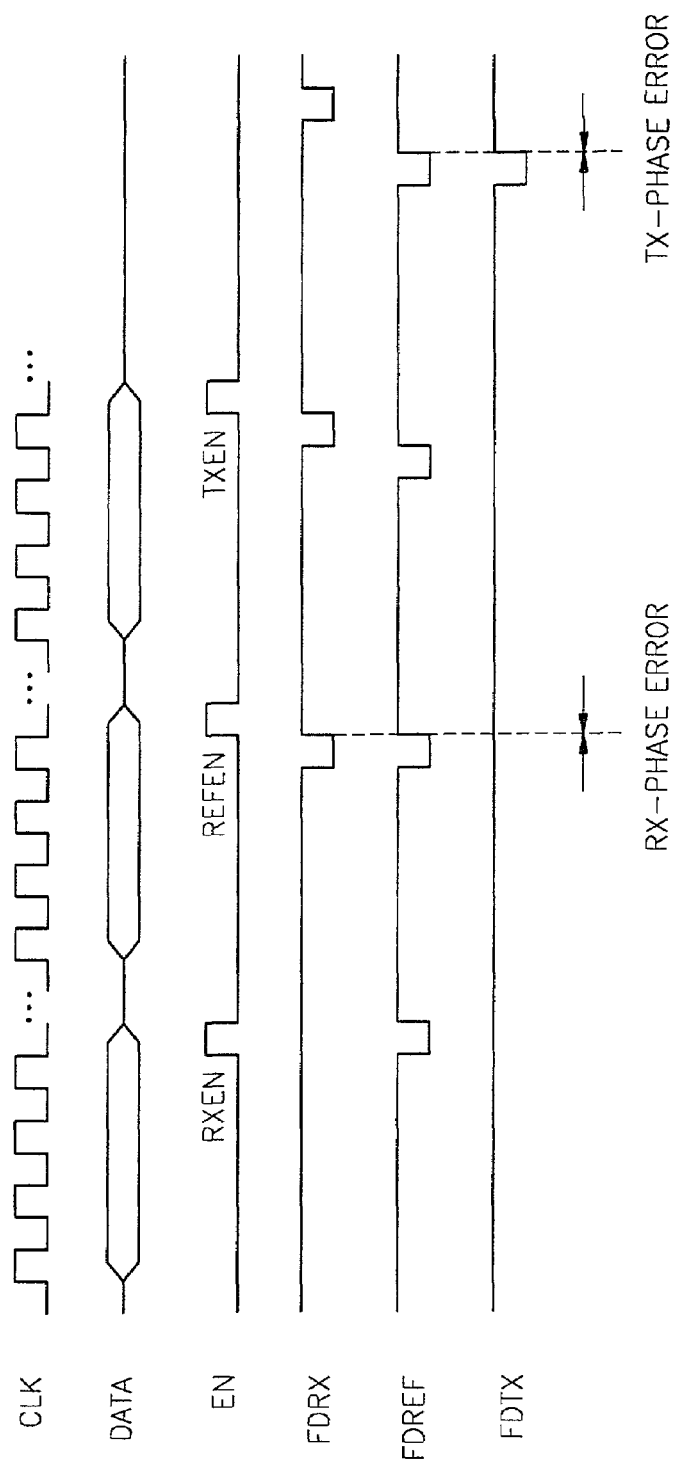
FIG. 6 is a waveform diagram illustrating signals corresponding to the operation of the phase locked loop of FIG. 5, according to an illustrative embodiment of the invention.

FIG. 6 is a waveform diagram illustrating signals corresponding to the operation of the phase locked loop of FIG. 5, according to an illustrative embodiment of the invention. Referring to FIGS. 5 and 6, when the reception enable signal RXEN is logic high after the output signal FDREF of the reference divider 330 is generated by the reference enable signal REFEN, the output signal RXCONEN of the first flip-flop 361 of the second control circuit 360 turns on the first switch 321 of the reception divider 320. If the reception division data signal RXDD of the latch 111 is supplied to the reception counter 322 via the first switch 321, the reception counter 322 generates an output signal FDRX which is synchronized with the output signal FDREF of the reference divider 330, however, is delayed by one period of the output signal FDREF.

When the reception enable signal TXEN is logic high after the output signal FDREF of the reference divider 330 is generated by the reference enable signal REFEN, the output signal TXCONEN of the second flip-flop 362 of the second control circuit 360 turns on the third switch 341. If the transmission division data signal TXDD of the latch 111 is supplied to the transmission counter 342 via the third switch 341, the transmission counter 342 generates an output signal FDTX which is synchronized with the output signal FDREF of the reference divider 340, however, is delayed by one period of the output signal FDREF.

The two compared signals described above, such as FDRX and FDREF or FDTX and FDREX, are synchronized with each other just as they are generated. Therefore, lock-time is determined depending on the actual difference between the two compared signals in phase and frequency.

As described above, the phase locked loop (PLL) circuit according to the present invention, makes signals which are compared with each other by a detector synchronized with each other and consequently the lock-time is determined on the actual difference between the two compared signals in phase and frequency. Therefore, delay in the lock-time caused by the asynchronism of signals can be considerably reduced.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A phase locked loop (PLL) circuit having a receiver voltage controlled oscillator (VCO), a transmitter VCO, and a crystal oscillator, the PLL circuit comprising:

a control circuit for generating a reference control signal in response to a reception enable signal and a transmission enable signal;

a reception divider for receiving a reception division data signal in response to the reception enable signal and dividing an output signal of the receiver VCO according to the reception division data signal;

a reference divider for receiving a reference division data signal in response to the reference control signal of the control circuit and dividing the output signal of the crystal oscillator according to the reference division data signal;

a transmission divider for receiving a transmission division data signal in response to the transmission enable signal and dividing an output signal of the transmitter VCO according to the transmission division data signal;

a first phase detector for detecting frequency and phase differences between an output signal of the reception divider and an output signal of the reference divider; and a second phase detector for detecting the frequency and phase differences between an output signal of the transmission divider and the output signal of the reference divider.

2. The phase locked loop circuit of claim 1, wherein the control circuit comprises an apparatus for performing a logic OR operation on the reception enable signal and the transmission enable signal.

3. The phase locked loop circuit of claim 1, wherein the reception divider comprises:
   a first switch for gating the reception division data signal in response to the reception enable signal; and
   a reception counter for dividing the output signal of the receiver VCO in response to an output signal of the first switch.

4. The phase locked loop circuit of claim 1, wherein the reference divider comprises:
   a second switch for gating the reference division data signal in response to the reference control signal of the control circuit; and
   a reference counter for dividing the output signal of the crystal oscillator in response to an output signal of the second switch.

5. The phase locked loop circuit of claim 1, wherein the transmission divider comprises:
   a third switch for gating the transmission division data signal in response to the transmission enable signal; and
   a transmission counter for dividing the output signal of the transmitter VCO in response to an output signal of the third switch.

6. The phase locked loop circuit of claim 1, further comprising:
   a latch for receiving serial data signals and outputting the reception division data signal, the reference division data signal, the transmission division data signal, the reception enable signal, the reference enable signal and the transmission enable signal.

7. The phase locked loop circuit of claim 3, wherein the first switch is an NMOS transistor.

8. The phase locked loop circuit of claim 3, wherein the first switch is a transmission gate.

9. A phase locked loop circuit having a receiver voltage controlled oscillator (VCO), a transmitter VCO, and a crystal oscillator, the PLL circuit comprising:
   a control circuit for outputting a reception control signal and a transmission control signal in response to a reception enable signal, and a transmission enable signal;
   a reception divider for receiving a reception division data signal in response to the reception control signal and dividing an output signal of the receiver VCO according to the reception division data signal;
   a reference divider for receiving a reference division data signal in response to a reference enable signal and dividing an output signal of the crystal oscillator according to the reference division data signal;

a transmission divider for receiving a transmission division data signal in response to the transmission control signal of the control circuit and dividing an output signal of the transmitter VCO according to the transmission division data signal;

a first phase detector for detecting frequency and phase differences between an output signal of the reception divider and an output of the reference divider; and a second phase detector for detecting the frequency and phase differences between an output signal of the transmission divider and an output signal of the reference divider.

10. The phase locked loop circuit of claim 9, wherein the control circuit comprises:
    a first inverter for inverting a phase of the reception enable signal;
    a second inverter for inverting a phase of the transmission enable signal;
    a first flip-flop having a clock terminal, an input terminal, and a reset terminal, to which is respectively applied an output signal of the reference divider, a power voltage, and an output signal of the first inverter, and having an output terminal that outputs the reception control signal; and
    a second flip-flop having a clock terminal, an input terminal, and a reset terminal, to which is respectively applied an output signal of the reference divider, the power voltage, an output signal of the second inverter, and having an output terminal that outputs the transmission control signal.

11. The phase locked loop circuit of claim 9, wherein the reception divider comprises:
    a first switch for gating the reception division data signal in response to the reception control signal of the control circuit; and
    a reception counter for dividing the output signal of the receiver VCO in response to an output signal of the first switch.

12. The phase locked loop circuit of claim 9, wherein the reference divider comprises:
    a second switch for gating the reference division data signal in response to the reference enable signal; and
    a reference counter for dividing the output signal of the crystal oscillator in response to an output signal of the second switch.

13. The phase locked loop circuit of claim 9, wherein the transmission divider comprises:
    a third switch for gating the transmission division data signal in response to the transmission control signal of the control circuit; and
    a transmission counter for dividing the output signal of the transmitter VCO in response to an output signal of the third switch.

14. The phase locked loop circuit of claim 9, further comprising:
    a latch for receiving serial data signals and outputting the reception division data signal, the reference division data signal, the transmission division data signal, the reception enable signal, the reference enable signal and the transmission enable signal.

15. The phase locked loop circuit of claim 11, wherein the first switch is an NMOS transistor.

16. The phase locked loop circuit of claim 11, wherein the first switch is a transmission gate.

* * * * *